United States Patent [19]

Glasser

[11] Patent Number: 4,665,503

[45] Date of Patent: May 12, 1987

[54] NON-VOLATILE MEMORY DEVICES

[75] Inventor: Lance A. Glasser, Lexington, Mass.

[73] Assignee: Massachusetts Institute of Technology, Cambridge, Mass.

[21] Appl. No.: 691,679

[22] Filed: Jan. 15, 1985

[51] Int. Cl.[4] .............................................. G11C 11/40
[52] U.S. Cl. ................................... 365/114; 365/184; 365/182; 357/23.6
[58] Field of Search ............... 365/114, 106, 182, 184, 365/218; 357/23

[56] References Cited

U.S. PATENT DOCUMENTS

| | | | |
|---|---|---|---|
| 3,626,387 | 12/1971 | Terman | 365/114 |
| 3,728,695 | 4/1973 | Frohman-Bentchkowsky | |
| 3,825,946 | 7/1974 | Frohman-Bentchkowsky | |
| 3,860,916 | 1/1975 | Tarui et al. | 365/114 |
| 3,987,474 | 10/1976 | Walker | 365/114 |
| 4,016,588 | 4/1977 | Ohya et al. | 357/23 |
| 4,161,039 | 7/1979 | Rossler | 365/185 |
| 4,250,569 | 2/1981 | Sasaki et al. | 365/185 |
| 4,300,212 | 11/1981 | Simko | 365/185 |
| 4,314,265 | 2/1982 | Simko | 357/23 |
| 4,334,292 | 6/1982 | Kotecha | 365/182 |
| 4,527,259 | 7/1985 | Watanabe | 365/114 |

Primary Examiner—Terrell W. Fears
Attorney, Agent, or Firm—Thomas J. Engellenner; James E. Maslow

[57] ABSTRACT

A programmable non-volatile memory cell is disclosed that can be written into the "1," "0," or "previous" state in the presence of unfocused illumination, preferably ultraviolet (UV) light. The programmed state is controlled by low electrical voltages. Once the illumination is removed the programmed state is non-volatile. The memory cell can be fabricated using conventional MOS processing techniques with no additional mask steps. The cell can thus be implemented on virtually all silicon gate nMOS and CMOS processes.

11 Claims, 6 Drawing Figures

NON-VOLATILE MEMORY DEVICES

The Government has rights in this invention pursuant to Contract Number N00014-80-C-0622 awarded by the U.S. Navy.

TECHNICAL FIELD

This invention relates to non-volatile semiconductor memory devices and, in particular, to erasable and reprogrammable memory devices fabricated by metal-oxidesemiconductor (MOS) techniques.

BACKGROUND OF THE INVENTION

Most memory devices found in MOS integrated circuits, such as dynamic registers and static random access memory (RAM) cells, are considered "volatile" because memory is lost if electric power is interrupted. Dynamic registers rely upon charges accumulated on particular circuit capacitances to store information. Unfortunately, the register charges leak with the passage of time and require refreshing, typically hundreds of times per second. Static RAM cells employ bistable (e.g., flip-flop) circuits. However, for such static cells to function, current must flow in response to noise excitations in one of two cross-coupled circuit branches. The volatility of dynamic registers and static RAM cells is a substantial disadvantage and many efforts have been made over the past decade to develop inexpensive, non-volatile MOS memories.

The efforts to develop non-volatile devices have focused on floating gate structures, which are generally defined by a floating island of conducting material, which is electrically insulated from (while remaining capacitively coupled to) a substrate to form a gate overlying the channel of a field effect transistor (FET). Charge stored on the gate is "read" by its effect on the transistor.

Electrically programmable floating gate structures are known. For example, U.S. Pat. Nos. 3,728,695 and 3,825,946 issued to Frohman-Bentchkowsky disclose MOS structures having a floating gate, as described above, and one or more further gates arranged to charge or discharge the floating gate by producing an avalanche breakdown at a junction and thereby permitting electron tunneling into or out of the gate element. Typically, high currents have been required during the programming of such devices because only a small fraction of the programming current is sufficiently displaced and energetic enough to reach the floating gate. Other devices, such as those disclosed in U.S. Pat. No. 4,334,292, have employed electron beams or hot electron injection techniques to charge floating gate structures. A number of devices have also made use of photoelectric effects (e.g., irradiation with ultraviolet light) to erase the charge on a floating gate by employing an insulating oxide which becomes conductive when irradiated.

One of the most serious disadvantages of known non-volatile memory devices has been their manufacturing complexity. It is not uncommon for an electrically alterable floating gate device to require seven or more masking steps. When an electron injector or an electrically erasable feature is also included, even more masking steps and other fabrication difficulties are encountered.

There exists a need for better non-volatile memory devices that are economical to manufacture and simple to use. In particular, memory devices that require few masking steps and do not rely on individual electron beams or charge injectors for each memory cell, would satisfy a long-felt need in the industry. Such devices would make it economical to introduce non-volatile memory to almost any integrated circuit chip and allow, for example, customized processing elements or cryptographic communication modules to be fabricated inexpensively.

Moreover, there exists a need for arrays which provide a simple interface between static RAM cells and non-volatile memory devices. A simple, economical device that integrated a RAM circuit and a non-volatile element would be a significant improvement in the art. By arranging such combination devices into an array, non-volatile data storage can be accomplished much faster.

SUMMARY OF THE INVENTION

A programmable non-volatile memory cell is disclosed that can be written into the "1," "0," or "previous" state in the presence of unfocused illumination, preferably ultraviolet (UV) light. The programmed state is controlled by low electrical voltages. Once the illumination is removed the programmed state is non-volatile. The memory cell can be fabricated using conventional MOS processing techniques with no additional mask steps. The cell can thus be implemented on virtually all silicon gate nMOS and CMOS processes.

In its simplest form the memory device consists of a field effect transistor having a source region and a drain region separated by a channel, and a floating gate electrode disposed above the channel and separated therefrom by a gate-insulating layer. The floating gate electrode is further defined by a capacitance disposed between the floating gate and a controlled potential thereby permitting the storage of charge on the floating gate. Programming is accomplished by an illumination means and a writing means. The illumination means exposes the transistor (but not the capacitor) to radiation, preferably UV light, thereby rendering conductive the insulating layer disposed below the floating gate electrode of the transistor; the writing means alters the charge on the floating gate during the operation of the illumination means. The device is read by detecting the effect on the transistor of the presence (or absence) of a charge on the floating gate. All reading and writing operations can be accomplished with power supplied to the chip. This new field programmable device allows one to add hundreds of bits of non-volatile storage to virtually any silicon gate MOS chip.

The memory cell takes advantage of the fact that under UV excitation electrons can surmount the silcon/silicon-dioxide interface. When the light impinges on the gate/source or gate/drain region of a MOS transistor, it has the effect of making the gate oxide appear leaky. This principle, which only has been used in the past to erase PROMs, is extended to allow both the writing and erasing of a simple, inexpensive, non-volatile memory device.

In one illustrated embodiment, the writing means include a "SET" input line and a "RESET" input line with the SET line and the floating gate electrode serving as inputs to a first NOR gate. In this illustrated design the output of the first NOR gate and the RESET input line serve as the input to a second NOR gate. The output of the second NOR gate is connected to the source of the memory device, thereby creating a cascading arrangement of the first and second NOR gates to permit the programming of "1," "0," or "previous" states in the presence of UV light. To write a "1" the user raises the SET line and floods the chip with UV light. The floating gate will charge up to $V_{DD}$ minus an offset which is dependent upon the frequency of the light and the height of the metal-to-oxide barrier. To write a "0" one raises the reset line. When the UV excitation is removed, the data is stored. To retain the previous state, and this is important in many cases where one only wants to change a few bits of the programming, the user leaves the set and reset lines low while power and illumination are applied. The two cascading NOR gates will assure that the last stored value is retained.

The memory devices of the present invention can be arranged in an array and can further include means for selectively activating the writing means of individual memory devices. One such implementation would include a multiplexer to remote signals along the set and reset lines of individual memory cells.

In another illustrated embodiment, the non-volatile memory cells can be incorporated into combination devices that also include volatile (e.g., static RAM) circuits. Such combination devices increase the speed with which a large array of non-volatile memory cells can be written by allowing the user to first write the data sequentially into a shadow static RAM array and then transfer the data in parallel to the floating gates of the non-volatile elements. Thus, each combination device includes a "shadow latch" which is enabled by an additional input line SE. The "write" sequence for this combination device begins with the raising of SE for the collection of cells and then the activation of the appropriate set and reset lines to store the data in the shadow registers. The non-volatile elements are then programmed by illuminating the chip with UV light, thereby enabling all the floating gates to be written simultaneously. Lowering the SE line disables the static shadow registers and turning off the UV light completes the programming.

The invention will next be described in connection with certain preferred embodiments. However, it should be clear that those skilled in the art can make various changes, modifications, additions and subtractions without departing from the spirit or the scope of the invention. For example, while the embodiments described below are implemented in n-channel MOS technology, the basic teachings of this invention are equally applicable to other fabrication techniques such as p-channel or complementary MOS technologies. In addition to the combination devices described below which provide an interface between an array of static RAM cells and the memory devices of the present invention, other structures can also be added to the non-volatile memory cells disclosed herein.

DETAILED DESCRIPTION

Figure 1:
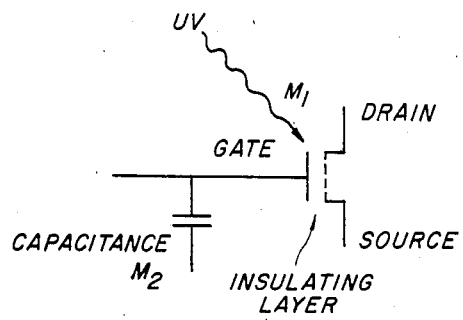
FIG. 1 is a schematic diagram of a simple memory device according to the invention.

With reference to FIG. 1, the invention is illustrated schematically in a simple form, consisting of a UV-sensitive memory transistor $M_1$ in conjunction with a charge storage capacitor $M_2$. When UV light impinges on the physical region where the source and gate of $M_1$ come into close proximity, electrons can travel between the gate and source. This will cause the gate voltage to approach the source voltage (minus an offset). The gate can be programmed by controlling either source voltage or the voltage on the other side of capacitor $M_2$, or both. Once the UV light is turned off, the charge on the gate is effectively trapped to form a non-volatile memory device. The charge stored on the gate is read by its effect on the transistor.

Figure 2:
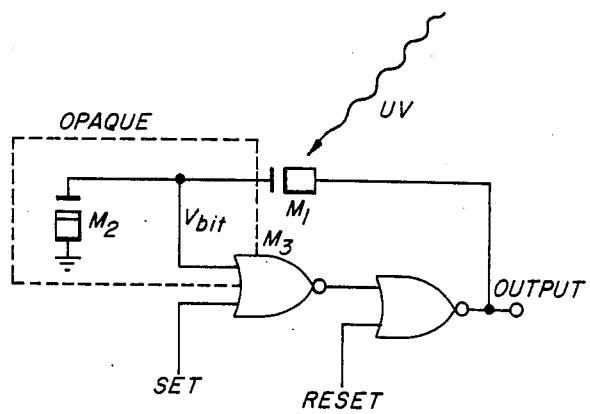
FIG. 2 is a schematic diagram of a memory device according to the invention, which can be programmed to store either a "1" or a "0" or to hold its last state.

In FIG. 2 an embodiment of the invention is shown schematically which can be written into the "1," "0," or "previous" state in the presence of unfocused UV light. The UV-sensitive memory transistor $M_1$ described above has been simplified into a capacitor structure by tying together the source and drain. Thus, when UV light impinges on the gate/source or gate/drain of $M_1$, photo-excited electrons can flow through the gate oxide so as to equalize the quasi-Fermi levels. In the illustrated embodiment, the node $V_{bit}$ can be implemented entirely in polysilicon. This is the floating gate. Only the floating gate area over the MOS capacitor $M_1$ is open to illumination. The rest of the node is covered by opaque material, such as aluminum.

Figure 3:
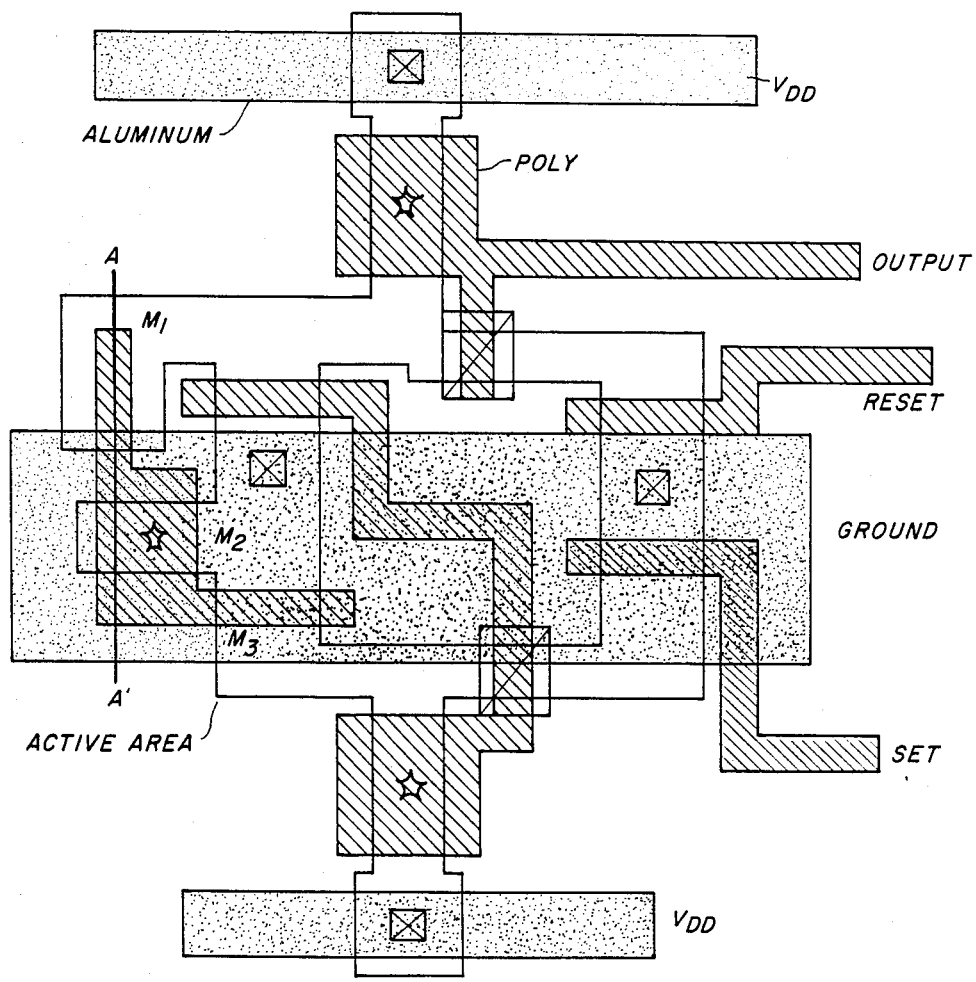
FIG. 3 is a top plan view of an illustrative MOS embodiment of the device of FIG. 2.

An illustrative layout is shown in FIG. 3. As noted above, the UV-sensitive memory element $M_1$ is open to illumination and is implemented in polysilicon. Likewise, $M_2$, the charge storage capacitor, is implemented in polysilicon by sandwiching a thin oxide film between the gate structure and a depletion implant. The polysilicon gate also forms transistor $M_3$ (which is part of the SET NOR gate as shown in FIG. 2). Since the floating gate is integral with the $M_2$ and $M_3$ elements as well as $M_1$, both capacitor $M_2$ and transistor $M_3$ are covered by an opaque (e.g. metal) layer to avoid discharges; similiarly, the remainder of the poly over field region should be shielded from illumination by an overlying metal layer.

Figure 4:
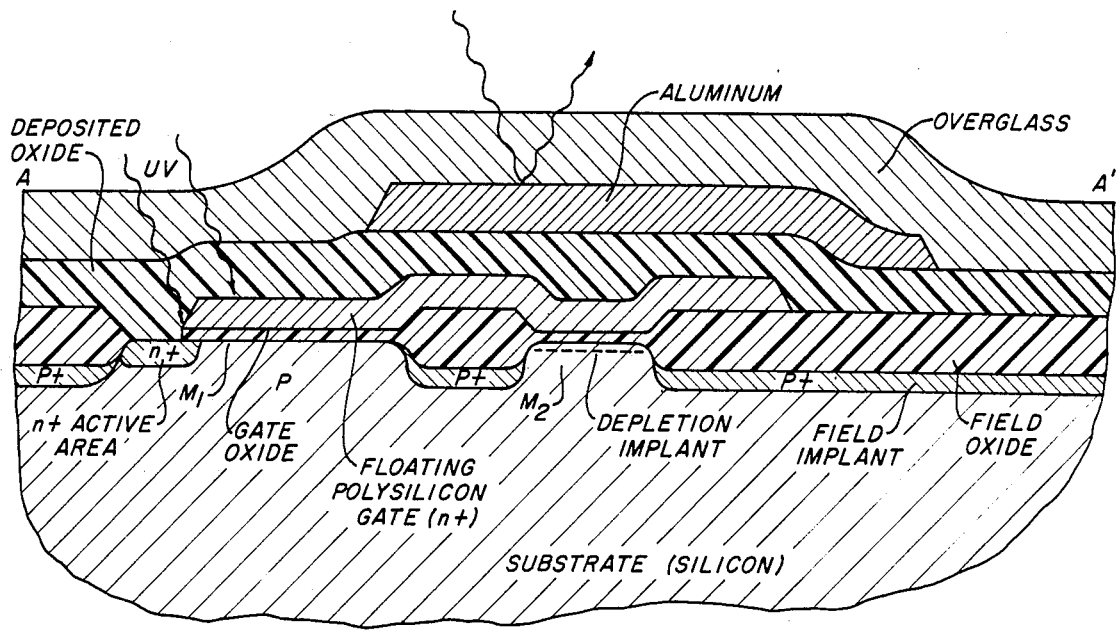
FIG. 4 is a cross-sectional view of the embodiment of FIG. 3 along line A—A'.

In the illustrated embodiment of FIGS. 2–4, the SET NOR gate and the RESET NOR gate are each implemented with MOS fabrication techniques by two enhancement mode pull-down transistors in parallel with a depletion mode pull-up transistor. In FIG. 3 the star symbols represent the depletion mode transistors and the rectangles with a diagonal slashes represent the buried contacts which connect the polysilicon gates of the depletion mode pull-up transistors to their sources and to the drains of the enhancement mode pull-down transistors. The "X" within a square symbol represents a metallized contact between a metal line and an underlying active (n+) layer.

A cross-sectional view through a portion of the floating gate structure is shown in FIG. 4. The cross-sectional view is taken along line A-A' as shown in FIG. 3. As can be appreciated from FIG. 4, the fabrication of the illustrated layout begins with p-type silicon substrate which is initially masked for the implantation of boron or the like to form p+ field implants. These implanted areas are then exposed to oxygen and baked to build up a thick oxide (field oxide) layer over the field implants. (During the process the p+ implants are driven down into the substrate).

A similiar masking and implantation technique is employed to form slight n-type implants of arsenic, phosphorous or one like, thus creating the depletion-mode devices (such as capacitor $M_2$ shown in FIG. 4). The wafer is then cleaned and a thin layer of silicon dioxide is grown to form the gate insulators.

In the next stage, the conductive polysilicon layer is laid down and patterned by etching or the like to form the various gate structures. Once the polysilicon areas have been established, active n-type regions are formed by diffusion, after selectively removing the oxide layer over these regions. Following the formation of the active elements of the memory device, an oxide layer and a metal layer are then deposited. The oxide is selectively removed prior to metal deposition to form contacts between the metal layer and the polysilicon structures. After deposition the metal layer is patterned to form the ground line and $V_{DD}$ lines. In the final step, the entire device is coated with another layer of oxide (overglass) to provide physical protection.

A device similiar to the one described in connection with FIGS. 2-4 was built in 4 micron nMOS and has demonstrated months of storage time at room temperature. Write times on the order of 10 minutes were observed. Since the storage mechanism is similiar to that used in many commercial programmable-read-only-memory (PROM) devices, no problems with long term storage are anticipated. However, it should be noted that the layout was not optimized because the grounded metal line shading the floating gate, $V_{bit}$, provided a source of photo-excited electrons and therefore limited the gate's maximum potential. In practice, the gate voltage varied between −2 and +3 volts rather than an optimal 0 and 5 volts. This problem can be solved by providing a low trigger voltage on the SET NOR gate and by shading $V_{bit}$ instead with a metal line connected to the OUTPUT line.

Figure 5:
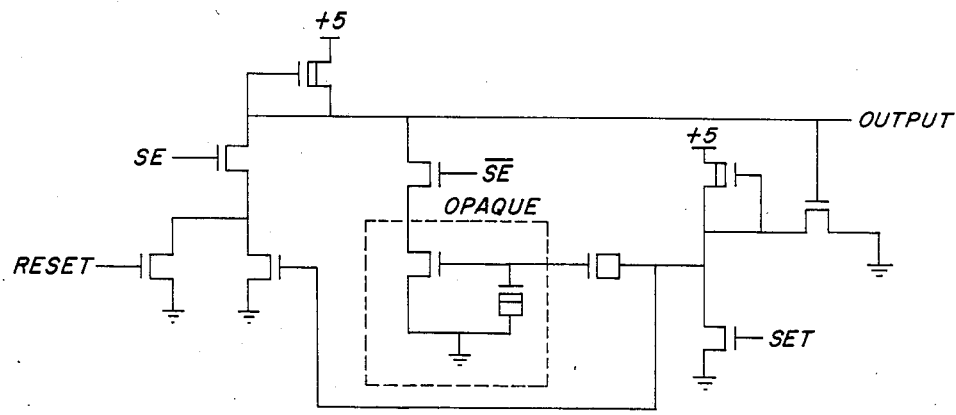
FIG. 5 is a schematic diagram of a combination volatile/non-volatile memory device according to the invention.

In FIG. 5 a combination static RAM cell and nonvolatile memory device is illustrated schematically. When arranged in an array such combination devices allow fast programming of large amounts of data. The user first writes the data sequentially into the "shadow" static RAM cells and then transfers the data in parallel from the RAM cells into the associated non-volatile elements upon illumination. In FIG. 5 a "shadow latch" is formed by two cross-coupled inverters when enabled by the additional input line SE (and its inverse, $\overline{SE}$).

Figure 6:
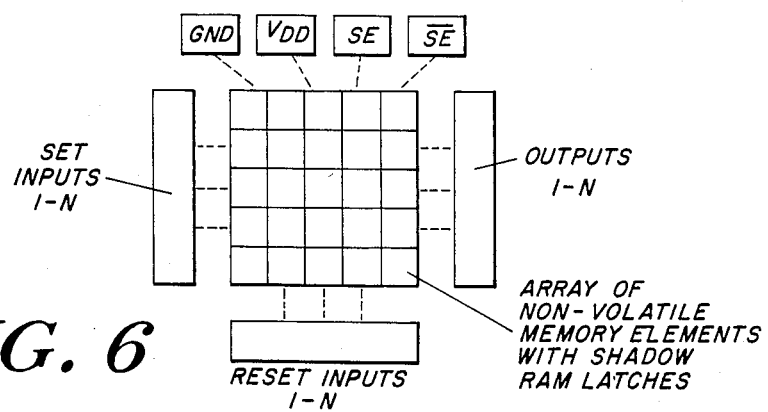
FIG. 6 is a representation of an array of devices used in combination to describe the invention.

The write sequence for an array of combination devices, as shown schematically in FIG. 6, begins by raising the SE line for the collection of combination cells that form the array. Next the appropriate SET and RESET lines are activated to store (or modify) data in particular cells. (In practice, the SET and RESET signals for particular cells can be multiplexed along a single line with appropriate decoders incorporated into the memory structure). The array is then illuminated with UV light so that all the floating gates are written simultaneously. The SE line is then lowered to disable the static shadow registers and the UV excitation is turned off. The shadow latch arrangement is also particularly useful because the SET and RESET lines can be held low while the array is programmed, thus lowering the number of I/0 pins required for a given write time.

Having described the present invention in connection with certain illustrations, these embodiments as well as various modifications are intended to be covered by the following claims.

I claim:

1. A memory device comprising:
  A. a field effect transistor having a source region and a drain region separated by a channel, and a floating gate electrode disposed above the channel and separated therefrom by a gate insulating layer;
  B. a capacitance disposed between the floating gate and a controlled potential thereby permitting the storage of a charge on the floating gate, the capacitance being shielded from exposure to any illuminating radiation;
  C. illuminating means for exposing the transistor to radiation thereby rendering the insulating layer conductive during the exposure;
  D. writing means for altering the charge on the floating gate during operation of the illuminating means; and
  E. reading means for detecting the presence of charge on the floating gate.

2. The device of claim 1 wherein said illumination means is a source of ultraviolet radiation.

3. The device of claim 1 wherein the capacitance is further defined by a capacitor formed by a second insulating layer disposed between the floating gate and a region maintained at a fixed potential.

4. The device of claim 1 wherein the capacitance is further defined by a capacitor formed by a second insulating layer disposed between the floating gate and a conductive line of variable electrical potential.

5. The device of claim 1 wherein said source and drain of said transistor are connected together.

6. The device of claim 1 wherein said writing means further includes a SET input line and a RESET input line;
  the SET line and the floating gate electrode serving as inputs to a first NOR gate;
  the output of the first NOR gate and the RESET input line serving as inputs to a second NOR gate; and
  the output of said second NOR gate being connected to the source of said memory device, whereby the cascading arrangement of said first and second NOR gates permit a user to program a binary "1" value on the floating gate by raising only the SET line, to program a binary "0" value on the floating gating by raising only the RESET line, and to retain the previous value of the floating gate whenever both the SET and RESET lines are low.

7. The device of claim 6 wherein each of said NOR gates is implemented by a depletion mode pull-up transistor in conjunction with two parallel, enhancement mode pull-down transistors.

8. The device of claim 6 wherein the output of said second NOR gate also comprises the reading means of said device.

9. An array of memory cells, the array comprising a plurality of memory devices according to claim 1; and selective activation means for activity the writing means of said individual memory devices.

10. The array of claim 9 wherein a single illumination means serves to illuminate the floating gates of the plurality of memory devices during the operation of their writing means.

11. A combination memory device employing both volatile and non-volatile memory elements to permit parallel writing of such devices in an array configuration, the combination device comprising:
  A. a static random access memory cell formed by a cross-coupled, bistable, register circuit and means for latching said cell into one of its bistable states;
  B. a field effect transistor having a source region and a drain region separated by a channel, and a floating gate electrode disposed above the channel and separated therefrom by an insulating layer;
  C. a capacitance disposed between the floating gate and a controlled potential thereby permitting the storage of a charge on the floating gate, the capacitance being shielded from exposure to radiation;
  D. illuminating means for exposing the transistor to radiation thereby rendering the gate insulating layer conductive during exposure;
  E. writing means for altering the charge on the floating gate during operation of the illumination means and in response to the state of the static memory cell; and
  F. reading means for detecting the presence of charge on the floating gate.

* * * * *